US010937511B2

(12) United States Patent
Her et al.

(10) Patent No.: US 10,937,511 B2
(45) Date of Patent: Mar. 2, 2021

(54) SEMICONDUCTOR MEMORY DEVICE, MEMORY SYSTEM INCLUDING CONTROLLER, AND METHOD OF OPERATING CONTROLLER

(71) Applicant: SK hynix Inc., Icheon-si (KR)

(72) Inventors: Min Ho Her, Cheongju-si (KR); Dong Hyun Kim, Icheon-si (KR); Seung Il Kim, Cheongju-si (KR); Youn Ho Jung, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/663,187

(22) Filed: Oct. 24, 2019

(65) Prior Publication Data
US 2020/0381064 A1    Dec. 3, 2020

(30) Foreign Application Priority Data

May 29, 2019    (KR) .................. 10-2019-0063450

(51) Int. Cl.
| G11C 16/34 | (2006.01) |
| G11C 16/16 | (2006.01) |
| G11C 16/26 | (2006.01) |
| G11C 16/08 | (2006.01) |
| G11C 16/24 | (2006.01) |

(52) U.S. Cl.
CPC .......... *G11C 16/3404* (2013.01); *G11C 16/08* (2013.01); *G11C 16/16* (2013.01); *G11C 16/24* (2013.01); *G11C 16/26* (2013.01)

(58) Field of Classification Search
CPC ..... G11C 16/3404; G11C 16/24; G11C 16/08; G11C 16/16; G11C 16/26
See application file for complete search history.

(56) References Cited

U.S. PATENT DOCUMENTS

| 2019/0214067 A1* | 7/2019 | Nam ................. H01L 27/11582 |
| 2020/0020404 A1* | 1/2020 | Kim ......................... G11C 8/08 |

FOREIGN PATENT DOCUMENTS

| KR | 1020160150554 A | 12/2016 |
| KR | 1020170003779 A | 1/2017 |

* cited by examiner

*Primary Examiner* — Ajay Ojha
(74) *Attorney, Agent, or Firm* — William Park & Associates Ltd.

(57) ABSTRACT

A method of operating a controller that controls an operation of a semiconductor memory device includes controlling the semiconductor memory device to perform an operation for a selected memory block, determining whether or not the operation is successful, and compensating for a change in a threshold voltage distribution of select transistors by changing an operation voltage applied to the select transistors included in the selected memory block, based on whether or not the operation is successful.

20 Claims, 12 Drawing Sheets

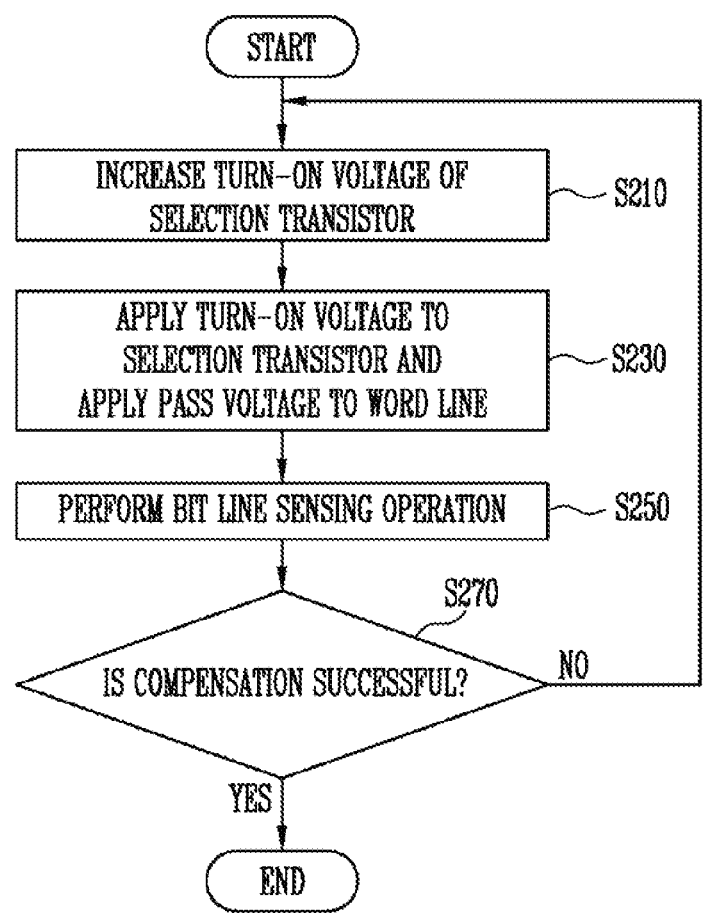

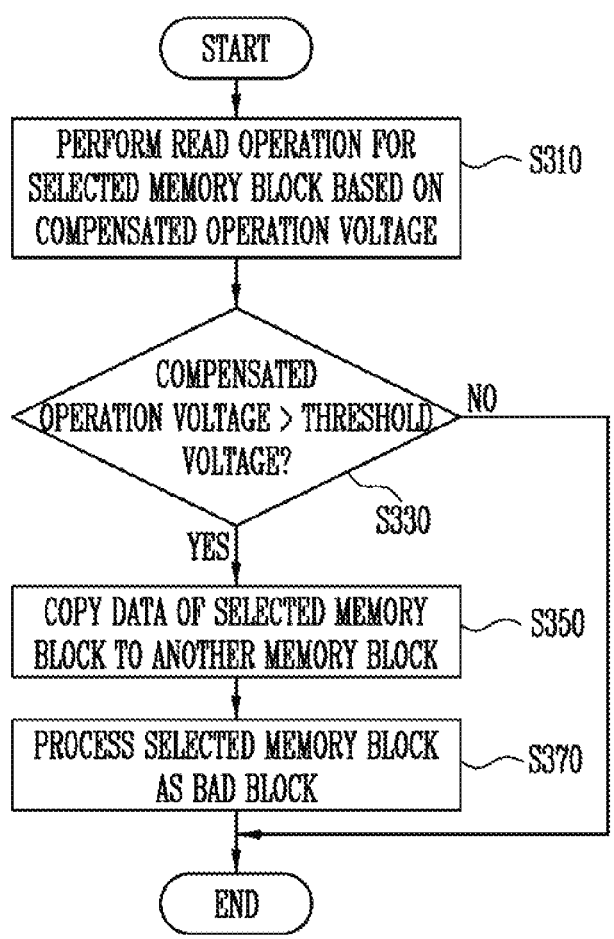

SEMICONDUCTOR MEMORY DEVICE, MEMORY SYSTEM INCLUDING CONTROLLER, AND METHOD OF OPERATING CONTROLLER

CROSS-REFERENCE TO RELATED APPLICATION

The present application claims priority under 35 U.S.C. § 119(a) to Korean patent application number 10-2019-0063450, filed on May 29, 2019, in the Korean Intellectual Property Office, the entire disclosure of which is incorporated herein by reference.

BACKGROUND

1. Technical Field

The present disclosure relates to an electronic device, and more particularly, to a semiconductor memory device, a memory system including a controller, and a method of operating the controller.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a memory device designed in order to resolve a limit of integration of a two-dimensional semiconductor memory device, and may include a plurality of memory cells that are vertically stacked on a semiconductor substrate.

A controller may control all operations of the semiconductor memory device. A memory system may include the controller and the semiconductor memory device.

SUMMARY

According to an embodiment of the present disclosure, a method of operating a controller that controls an operation of a semiconductor memory device includes controlling the semiconductor memory device to perform an operation for a selected memory block, determining whether or not the operation is successful, and compensating for a change in a threshold voltage distribution of select transistors by changing an operation voltage applied to the select transistors included in the selected memory block, based on whether or not the operation is successful.

According to another embodiment of the present disclosure, a memory system includes a semiconductor memory device including a plurality of memory blocks, and a controller configured to control an operation of the semiconductor memory device. The plurality of memory blocks includes a plurality of memory cells connected to a plurality of word lines and a plurality of select transistors connected to a select line, respectively, and the controller controls the semiconductor memory device to perform an operation for a selected memory block among the plurality of memory blocks, and controls the semiconductor memory device to compensate for a change in a threshold voltage distribution of select transistors by changing an operation voltage of the select transistors included in the selected memory block when the operation has failed.

BRIEF DESCRIPTION OF THE DRAWINGS

FIG. 10 is a flowchart illustrating step S150 of FIG. 9.

FIG. 12 is a flowchart illustrating step S170 of FIG. 9.

DETAILED DESCRIPTION

The advantages and features of the present disclosure, and a method of accomplishing the advantages and features will be described through embodiments that are described below together with the accompanying drawings. However, the present disclosure is not limited to the embodiments described herein but may be embodied in other forms. The present embodiments are provided to describe the technical spirit of the present disclosure to those skilled in the art to which the present disclosure pertains so that those skilled in the art may easily implement the technical spirit of the present disclosure.

Throughout the specification, in a case in which a portion is "connected" to another portion, the case includes not only a case in which the portion is "directly connected" to the other portion but also a case in which the portion is "indirectly connected" to the other portion with another element interposed therebetween. Throughout the specification, in a case in which a portion includes a component, the case means that the portion may include other components without excluding other elements unless specifically stated otherwise.

Hereinafter, preferred embodiments of the present disclosure will be described with reference to the accompanying drawings. At this time, it should be noted that, in the accompanying drawings, the same components are denoted by the same reference symbols as possible. In addition, the detailed description of well-known functions and configurations that may obscure the gist of the present disclosure will be omitted.

An embodiment of the present disclosure provides a method of operating a controller, which may be capable of improving operation stability.

Another embodiment of the present disclosure may provide a memory system capable of improving operation stability.

Figure 1:
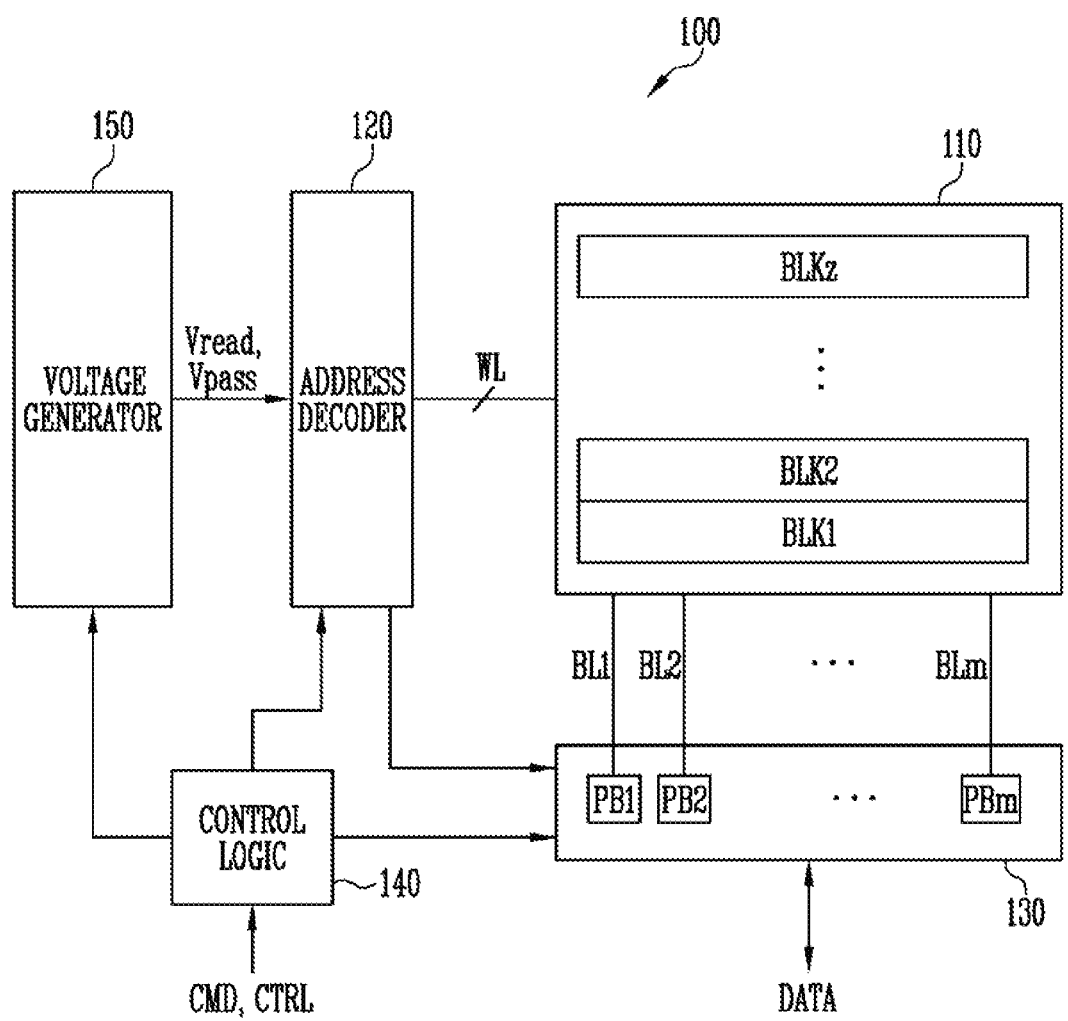
FIG. 1 is a block diagram illustrating a semiconductor memory device.

FIG. 1 is a block diagram illustrating a semiconductor memory device.

Referring to FIG. 1, the semiconductor memory device 100 includes a memory cell array 110, an address decoder 120, a read and write circuit 130, control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array having a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In yet another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address of received address. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, applies the pass voltage Vpass to the remaining unselected word lines.

The address decoder 120 is configured to decode a column address of the received address. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs the data DATA to the input/output buffer (not shown) of the semiconductor memory device 100. As an example of an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control all operations of the semiconductor memory device 100 in response to the control signal CTRL. In addition, the control logic 140 also outputs a control signal for adjusting a sensing node precharge potential level of the plurality of page buffers PB1 to PBm. The control logic 140 may control the read and write circuit 130 to perform the read operation of the memory cell array 110. The control logic 140 may be implemented as hardware, software, or a combination of hardware and software. For example, the control logic 140 may be a control logic circuit operating in accordance with an algorithm and/or a processor executing control logic code.

Meanwhile, during the program operation, the control logic 140 controls the peripheral circuit to perform an LSB program loop for storing LSB data and an MSB program loop for storing MSB data. According to performance of the MSB program loop, the threshold voltages of the memory cells connected to the selected word line may be divided into an erased state and first to third programmed states. In addition, during performance of the MSB program loop, the control logic 140 may control the peripheral circuit to program flag data indicating that the data programmed according to the program operation is the MSB data, after at least one verify operation of the first to third programmed states is performed.

As an example, the control logic may control the peripheral circuit to program the flag data after the verify operation for the first programmed state is performed. Alternatively, in another example, the control logic may control the peripheral circuit to program the flag data after the verify operation for the third programmed state is performed.

The voltage generator 150 generates the read voltage Vread and the pass voltage Vpass of the read operation in response to the control signal output from the control logic 140. In order to generate a plurality of voltages having various voltage levels, the voltage generator 150 includes a plurality of pumping capacitors that receive an internal power voltage, and generates the plurality of voltages by selectively activating the plurality of pumping capacitors in response to the control of the control logic 140.

Figure 2:
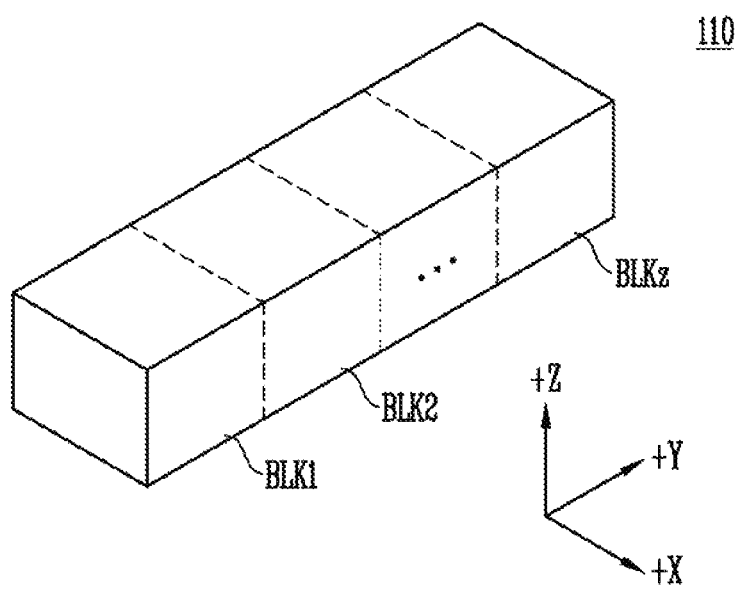
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such a plurality of memory cells are arranged along a +X direction, a +Y direction, and a +Z direction. The structure of each memory block is described with reference to FIGS. 3 and 4.

Figure 3:
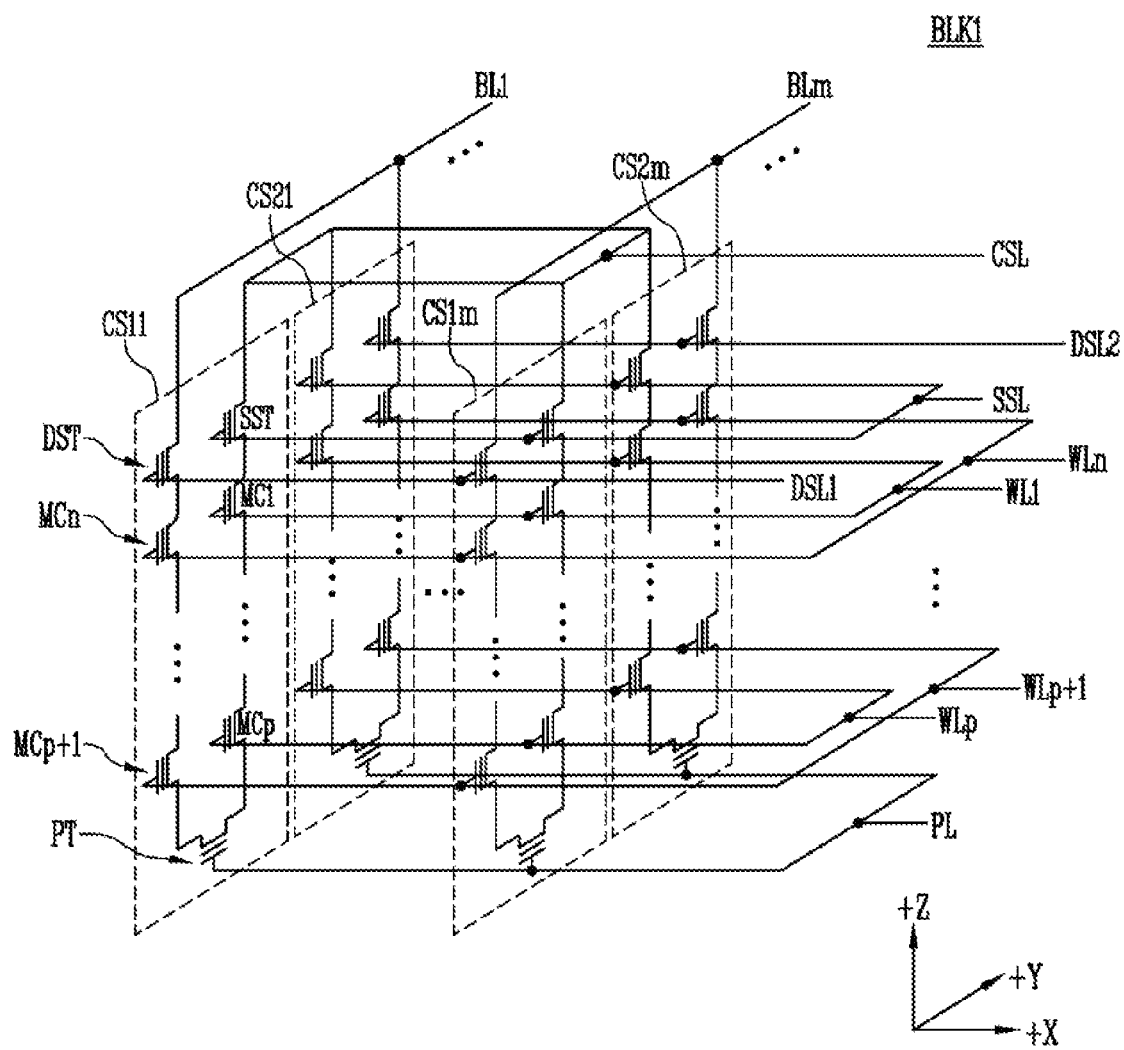
FIG. 3 is a circuit diagram illustrating an embodiment of any one memory block BLk1 of memory blocks BLK1 to BLKz of FIG. 2.

FIG. 3 is a circuit diagram illustrating an embodiment of any one memory block BLk1 of the memory blocks BLK1 to BLKz of FIG. 2.

Referring to FIG. 3, a first memory block BLK1 includes a plurality of cell strings CS11 to CS1m and CS21 to CS2m. In the first memory block BLK1, m cell strings are arranged in a row direction (that is, the +X direction). The m cell strings arranged in the row direction are connected to the first to m-th bit lines BL1 to BLm, respectively. q (q is a natural number) cell strings are arranged in a column direction (that is, the +Y direction). In FIG. 3, only two cell strings arranged in the column direction are shown for convenience of description.

Each of the plurality of cell strings CS11 to CS1m and CS21 to CS2m is formed in a 'U' shape. Each of the plurality of cell strings CS11 to CS1m and CS21 to CS2m includes a pipe transistor PT, memory cells MC1 to MCn, a source select transistor SST and a drain select transistor DST stacked on a substrate (not shown) under the memory block BLK1.

Each of the select transistors SST and DST and the memory cells MC1 to MCn may have a similar structure. For example, each of the select transistors SST and DST and the memory cells MC1 to MCn may include a channel layer, a tunneling insulating film, a charge storage film, and a blocking insulating film connected to a corresponding row line.

The source select transistor SST of each cell string is connected between a common source line CSL and the memory cells MC1 to MCp. A gate of the source select transistors SST is commonly connected to a source select line SSL.

The first to n-th memory cells MC1 to MCn of each cell string are connected between the source select transistor SST and the drain select transistor DST.

The first to n-th memory cells MC1 to MCn are divided into first to p-th memory cells MC1 to MCp and (p+1)-th to n-th memory cells MCp+1 to MCn. The first to p-th memory cells MC1 to MCp and the (p+1)-th to n-th memory cells MCp+1 to MCn are connected through a pipe transistor PT. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially stacked in the +Z direction, and are connected in series between the pipe transistor PT and the drain select transistor DST. Gates of the first to n-th memory cells MC1 to MCn are connected to the first to the n-th word lines WL1 to WLn, respectively.

A gate of the pipe transistor PT of each cell string is connected to the pipeline PL.

The drain select transistor DST of each cell string is connected between a corresponding bit line and the memory cells MCp+1 to MCn. The drain select transistors DST of the cell strings CS11 to CS1nn of a first row are connected to a first drain select line DSL1. The drain select transistors DST of the cell strings CS21 to CS2m of a second row are connected to a second drain select line DSL2.

The cell strings (for example, CS11 to CS1nn) arranged in the same row (+X direction) are connected to the same drain select line (for example, DSL1) through the corresponding drain select transistors. The cell strings (for example, CS11 and CS21) arranged in different rows are connected to different drain select lines DSL1 and DSL2.

The cell strings commonly connected to one bit line configure one column. For example, the cell strings CS11 and CS21 commonly connected to the first bit line BL1 correspond to a first column. Similarly, the cell strings CS1m and CS2m commonly connected to the m-th bit line BLm may correspond to an m-th column. According to FIG. 3, the memory block BLK1 includes m columns, and each column includes two cell strings.

In addition, the cell strings connected to one drain select line configure one row. For example, the cell strings CS11 to CS1m connected to the first drain select line DSL1 correspond to a first row, and the cell strings CS21 to CS1m connected to the second drain select line DSL2 correspond to a second row. According to FIG. 3, the memory block BLK1 includes two rows, and each row includes m cell strings.

Figure 4:
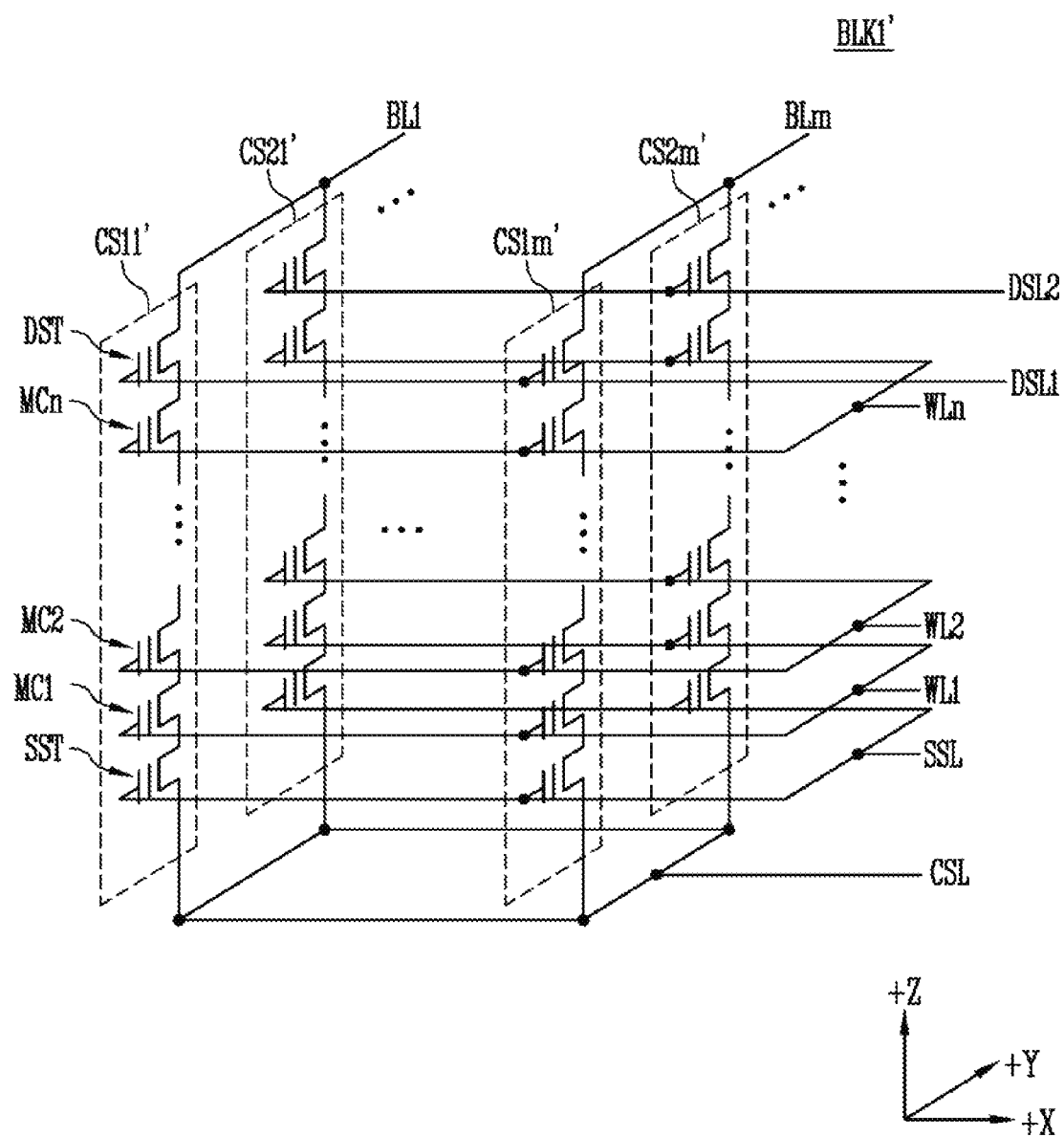
FIG. 4 is a circuit diagram illustrating another embodiment BLK1' of any one BLK1 of the memory blocks BLK1 to BLKz of FIG. 2.

FIG. 4 is a circuit diagram illustrating another embodiment BLK1' of any one BLK1 of the memory blocks BLK1 to BLKz of FIG. 2.

Referring to FIG. 4, a first memory block BLK1' includes a plurality of cell strings CS11' to CS1m' and CS21' to CS2m'. In the first memory block BLK1, m cell strings are arranged in the row direction (that is, the +X direction). The m cell strings arranged in the row direction are connected to the first to m-th bit lines BL1 to BLm, respectively. q (q is a natural number) cell strings are arranged in the column direction (that is, the +Y direction). In FIG. 4, only two cell strings arranged in the column direction are shown for convenience of description.

Each of the plurality of cell strings CS11' to CS1m' and CS21' to CS2m' extends along the +Z direction. Each of the plurality of cell strings CS11' to CS1m' and CS21' to CS2m' includes the source select transistor SST, the first to n-th memory cells MC1 to MCn, and the drain select transistor DST stacked on a substrate (not shown) under the memory block BLK1'.

The source select transistors SST of each cell string are commonly connected to the common source line CSL. The source select transistors SST of each cell string are connected between the common source line CSL and the memory cells MC1 to MCn. The gate of the source select transistor SST of each cell string is connected to the source select line SSL.

The first to n-th memory cells MC1 to MCn of each cell string are connected in series between the source select transistor SST and the drain select transistor DST. The memory cells of the same height are connected to the same word line. The first to n-th memory cells MC1 to MCn are connected to the first to n-th word lines WL1 to WLn, respectively.

The drain select transistor DST of each cell string is connected between the corresponding bit line and the memory cells MC1 to MCn. The drain select transistors of the cell strings arranged in the same row (+X direction) are connected to the same drain select line. The drain select transistors DST of the cell strings CS11' to CS1m' of the first row are connected to the first drain select line DSL1. The drain select transistors DST of the cell strings CS21' to CS2m' of the second row are connected to the second drain select line DSL2.

The cell strings commonly connected to one bit line configure one column. For example, the cell strings CS11' and CS21' commonly connected to the first bit line BL1 correspond to a first column. Similarly, the cell strings CS1m' and CS2m' commonly connected to the m-th bit line BLm may correspond to an m-th column. According to FIG. 4, the memory block BLK1' includes m columns, and each column includes two cell strings.

In addition, the cell strings connected to one drain select line configure one row. For example, the cell strings CS11' to CS1m' connected to the first drain select line DSL1 correspond to a first row, and the cell strings CS21' to CS1m' connected to the second drain select line DSL2 correspond to a second row. According to FIG. 4, the memory block BLK1' includes two rows, and each row includes m cell strings.

As a result, the memory block BLK1' of FIG. 4 has an equivalent circuit similar to the memory block BLK1 of FIG. 3 except that the pipe select transistor PT is excluded from each cell string.

In FIG. 4, the first to m-th cell strings CS11' to CS1m' or CS21' to CS2m' arranged in the row direction are connected to the first to m-th bit lines BL1 to BLm, respectively. As another embodiment, even bit lines and odd bit lines may be provided instead of the first to m-th bit lines BL1 to BLm. In addition, it may be understood that the even-numbered cell strings among the cell strings CS11' to CS1m' or CS21' to CS2m' arranged in the row direction are connected to even bit lines and the odd-numbered cell strings among the cell strings CS11' to CS1m' or CS21' to CS2m' arranged in the row direction are connected to odd bit lines, respectively.

Figure 5:
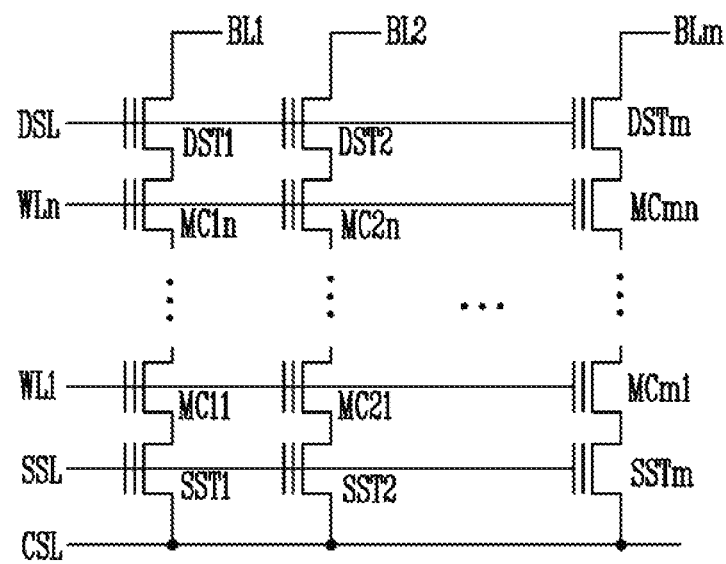
FIG. 5 is a circuit diagram illustrating a part of a configuration of the memory block included in the memory cell array.

FIG. 5 is a circuit diagram illustrating a part of a configuration of the memory block included in the memory cell array.

Referring to FIG. 5, the memory block may be connected to the drain select line DSL, the first and n-th word lines WL1 to WLn, and the source select line SSL. The drain select line is connected to the drain select transistors DST1 to DSTm. The first and n-th word lines are connected to corresponding memory cells MC11 to MCm1, MC12 to MCm2, . . . , and MC1 to MCmn, respectively. The source select line is connected to the source select transistors SST1 to SSTm. The drain select transistors DST1 to DSTm are connected to the corresponding bit lines BL1 to BLm, respectively, and the source select transistors SST1 to SSTm are connected to the common source line CSL.

The memory cells connected to one word line configure one page. For example, the memory cells MC11 to MCm1 connected to the first word line WL1 may configure one page. Meanwhile, the memory cells and the select transistors connected to one bit line configure one string. For example, the drain select transistor DST1, the memory cells MC11 to MC1n, and the source select transistor SST1 connected to the first bit line BL1 may configure one string. The drain select transistors DST1 to DSTm and the source select transistors SST1 to SSTm may be implemented as a transistor of a cell type, which includes a charge storage layer equally to the memory cells MC11 to MCm1, MC12 to MCm2, . . . , and MC1n to MCmn.

Figure 6:
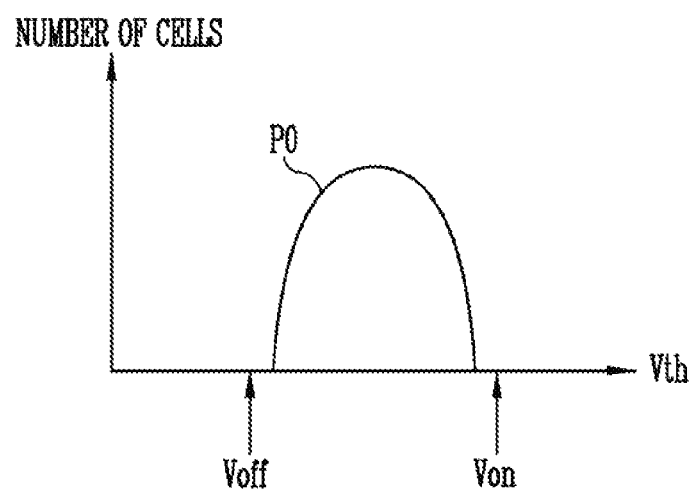
FIG. 6 is a diagram illustrating a threshold voltage distribution of a drain select transistor.

FIG. 6 is a diagram illustrating a threshold voltage distribution of the drain select transistor. Referring to FIG. 6, a distribution P0 of a threshold voltage Vth of the drain select transistors in the memory block BLK1 is shown. When a turn-off voltage Voff is applied to a gate electrode of the drain select transistor, since the turn-off voltage Voff is less than a threshold voltage of the drain select transistor, the drain select transistor is turned off. In addition, when a turn-on voltage Von is applied to the gate electrode of the drain select transistor, since the turn-on voltage Von is greater than the threshold voltage of the drain select transistor, the drain select transistor is turned off. Although the threshold voltage distribution of the drain select transistor is shown in FIG. 6, the threshold voltage distribution of the source select transistor may also be similarly shown.

Figure 7:
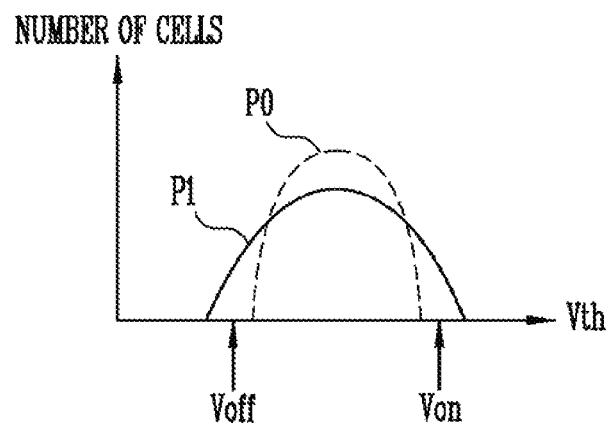
FIG. 7 is a diagram for describing an effect according to a change of the threshold voltage distribution of the drain select transistor.

FIG. 7 is a diagram for describing an effect according to a change of the threshold voltage distribution of the drain select transistor. Referring to FIG. 7, a situation is shown in which the threshold voltage distribution changes from the distribution P0 to a distribution P1 as the drain select transistor is repeatedly used. As the threshold voltage of the drain select transistor changes to the distribution P1, a drain select transistor that maintains a turn-on state even when the turn-off voltage Voff is applied is generated. In addition, as the threshold voltage of the drain select transistor changes to the distribution P1, a drain select transistor that maintains a turn-off state even when the turn-on voltage Von is applied is generated. Such a malfunction of the drain select transistor causes an error in an operation of storing data in a corresponding cell string, reading the data from the cell string, or erasing the data. Although the change of the threshold voltage distribution of the drain select transistor is shown in FIG. 7, the change of the threshold voltage distribution of the source select transistor may also be similarly shown.

Figure 8A:
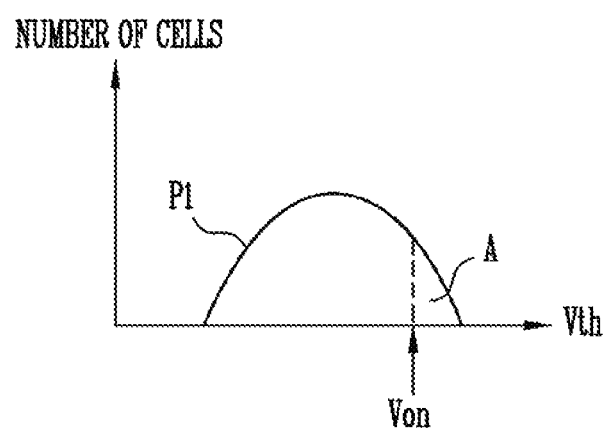
FIGS. 8A and 8B are diagrams for describing a malfunction according to the change of the threshold voltage distribution of the drain select transistor.
Figure 8B:
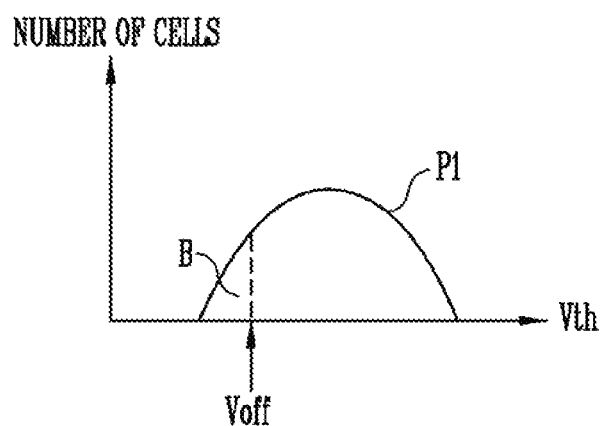

FIGS. 8A and 8B are diagrams for describing the malfunction according to the change of the threshold voltage distribution of the drain select transistor.

Referring to FIG. 8A, when applying the turn-on voltage Von to the drain select transistors of the distribution P1, the drain select transistors A having a threshold voltage greater than the turn-on voltage Von are not turned on. Accordingly, the drain select transistors A having the threshold voltage greater than the turn-on voltage Von are erroneously operated.

Referring to FIG. 8B, when applying the turn-off voltage Voff to the drain select transistors of the distribution P1, the drain select transistors B having a threshold voltage less than the turn-off voltage Voff are not turned off. Accordingly, the drain select transistors B having the threshold voltage less than the turn-off voltage Voff are erroneously operated.

According to the controller and a method of operating the controller according to an embodiment of the present disclosure, when an operation performance for the selected memory block is failed, the semiconductor memory device is controlled to perform an operation voltage compensation operation of the select transistor and to perform a first failed operation based on the compensated operation voltage. Therefore, operation reliability of the semiconductor memory device may be improved.

Figure 9:
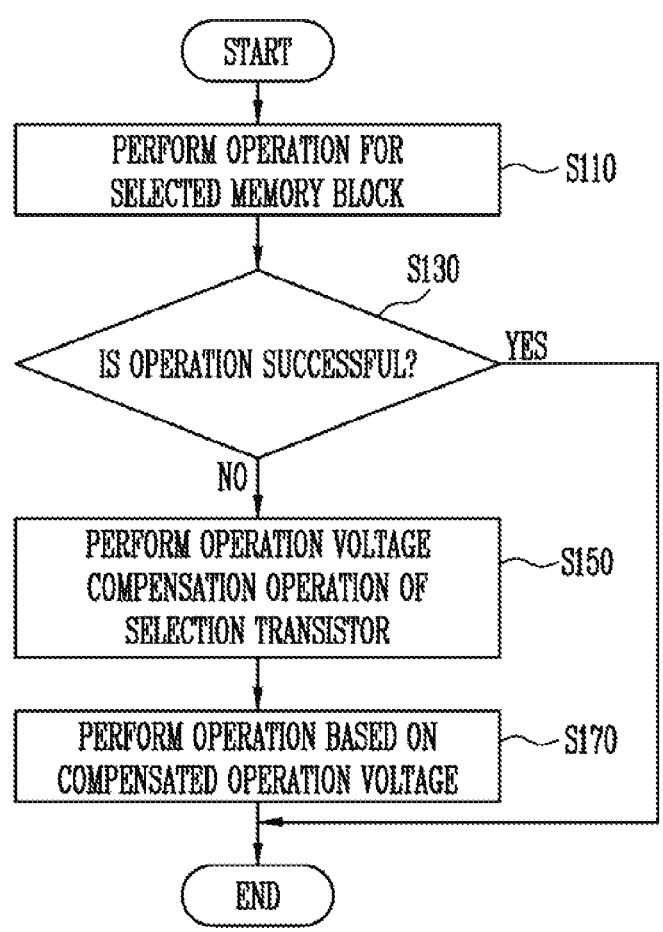
FIG. 9 is a flowchart illustrating a method of operating a controller according to an embodiment of the present disclosure.

FIG. 9 is a flowchart illustrating a method of operating a controller (i.e., 1100 of FIG. 13 or 2200 of FIGS. 14 and 15) according to an embodiment of the present disclosure.

Referring to FIG. 9, the method of operating the controller according to an embodiment of the present disclosure includes performing an operation for a selected memory block (S110), determining whether or not the operation for the selected memory block is successful (S130), and performing an operation voltage compensation operation of the select transistor of the selected memory block when the operation is failed (S150). Meanwhile, in an embodiment, the method of operating the controller according to an embodiment of the present disclosure may include performing the operation based on a compensated operation voltage (S170).

In step S110, the controller may control the semiconductor memory device 100 to perform a specific operation for the selected memory block by transmitting a specific command. For example, the controller may control the semiconductor memory device 100 to perform an operation which may include any one of a read operation, a program operation, and an erase operation by transferring any one of a read command, a program command, and an erase command to the semiconductor memory device 100.

In step S130, it is determined whether or not the operation of step S110 is successful. When the operation of step S110 is the read operation, the controller may analyze read data received from the semiconductor memory device 100 to determine whether or not the read operation is successful. For example, the controller may determine whether or not the read operation is successful by performing an error correction operation for the received read data. When the operation of step S110 is the program operation or the erase operation, the controller may receive a signal indicating whether or not the program operation or the erase operation is successful from the semiconductor memory device 100. In an embodiment, the controller may determine that a read operation is unsuccessful if an error correction operation on the received read data has been successfully performed. In an embodiment, the controller may determine that a read operation is successful if an error correction operation on the received read data has been failed. In an embodiment, the controller may determine whether or not the program operation or the erase operation was successful within the semiconductor memory device 100 after receiving the signal having information on the success or failure of the program or erase operation.

When the operation of step S110 is successfully performed (S130: YES), the operation is ended without performing the operation voltage compensation operation of the select transistor. When the operation of step S110 is not successful (S130: NO), an operation of compensating the operation voltage of the select transistor included in the selected memory block is performed (S150). A configuration of step S150 will be described later with reference to FIGS. 10, 11A, and 11B.

According to an embodiment, after step S150, the operation of step S110 may be performed again based on the compensated operation voltage of the select transistor (step S170). For example, when the operation of step S110 is the read operation, the read operation may be performed again based on the compensated operation voltage of the select transistor in step S170.

According to a degree of compensation needed for the operation voltage of the select transistor to perform the operation for the selected memory block, step S170 may perform processing the selected memory block as a bad block. An example of an embodiment of step S170 will be described later with reference to FIG. 12.

Figure 11A:
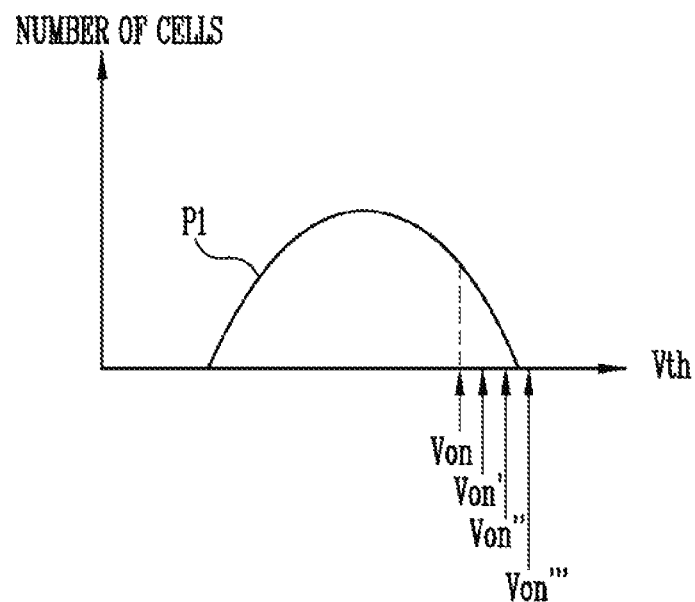
FIG. 11A is a graph for describing a method of compensating a turn-on voltage of a select transistor according to FIG. 10.

FIG. 10 is a flowchart illustrating step S150 of FIG. 9. In FIG. 10, an example in which the turn-on voltage Von of the drain select transistor shown in FIG. 8A is shown. Meanwhile, FIG. 11A is a graph for describing a method of compensating the turn-on voltage of the select transistor according to FIG. 10. Hereinafter, the description will be given with reference to FIGS. 10 and 11A.

Referring to FIG. 10, the step of compensating the operation voltage of the select transistor S150 includes increasing the turn-on voltage of the select transistor (S210), applying an increased turn-on voltage to the select transistor and applying the pass voltage to the word line (S230), performing a bit line sensing operation (S250), and determining whether or not the compensation of the operation voltage is successful based on a sensing operation result (S270).

In step S210, the turn-on voltage Von of the drain select transistor is increased to a turn-on voltage Von' as shown in FIG. 11A. Increasing the turn-on voltage of the drain select transistor may be performed by the controller transmitting a set-parameter command to the semiconductor memory device. The set-parameter command may be a command for setting parameters used in all operations of the semiconductor memory device. As an example, the set-parameter command includes a command for setting the operation voltage of the semiconductor memory device. In response to the received set-parameter command, the semiconductor memory device 100 may increase the turn-on voltage Von of the drain select transistor to the turn-on voltage Von'.

Thereafter, in step S230, the semiconductor memory device 100 applies the turned-on voltage Von' to the drain select transistor and applies the pass voltage to the word lines of the selected memory block. Step 230 may be performed by the semiconductor memory device 100 in response to a specific command transmitted from the controller. The pass voltage applied to the word line may be a read pass voltage. In step S230, the increased turn-on voltage Von' may be applied to the source select transistor of the selected memory block and the first turn-on voltage Von may be applied to the source select transistor of the selected memory block. The first turn-on voltage Von may be applied to the source select transistor when the operation failure of step S130 of FIG. 9 is expected to be caused by a threshold voltage distribution degradation of the drain select transistor. On the other hand, when the operation failure of step S130 in FIG. 9 is expected to be caused by the threshold voltage distribution degradation of the drain select transistor and the source select transistor, the increased turn-on voltage Von' may also be applied to the source select transistor.

Thereafter, the bit line sensing operation is performed in step S250. Step S250 may be performed by the semiconductor memory device 100 in response to the specific command transferred from the controller. In step S250, since the pass voltage is applied to all word lines, all memory cells will be turned on. On the other hand, when it is assumed that the threshold voltage distribution of the source select transistor is not degraded, all source select transistors will also be turned on. Therefore, as a result of bit line sensing, the drain select transistors having a threshold voltage less than the increased turn-on voltage Von' are turned on. The bit line connected to the drain select transistors which are turned on is in an active state and current flows. On the other hand, the drain select transistors having a threshold voltage greater than the increased turn-on voltage Von' are turned off. The bit line connected to the drain select transistors which are turned off is in an inactive state and no current flows. As the threshold voltage distribution is degraded, since there are drain select transistors which are turned off, in step S250 some bit lines will be inactive and no current will flow. The read data may be generated by the page buffer of the read and write circuit 130 and transferred to the controller according to the presence or absence of the current flowing through each bit line. For example, data of a bit line through which a current flows may be generated as "1", and data of a bit line through which a current does not flow may be generated as "0". The controller may determine whether or not the compensation is successful according to the number of 0 included in the received data. When the number of "0" is large in the received data, this means that the number of drain select transistors having the threshold voltage greater than the increased turn-on voltage Von' is large. Therefore, in this case, in step S270, the controller determines that the compensation is failed and proceeds to step S210 again.

In step S210, the turn-on voltage Von' of the drain select transistor is increased to a turn-on voltage Von". Thereafter, steps S230, S250, and S270 are repeatedly performed, and a current will not flow through some bit lines. Accordingly, it is determined in step S270 that the compensation is failed and the process proceeds to step S210 again. In step S210, the turn-on voltage Von" of the drain select transistor is increased to a turn-on voltage Von'". Referring to FIG. 11A, since there is no drain select transistor having a threshold voltage greater than the turn-on voltage Von'", it is determined in step S270 that the compensation is successful. Thus, step S150 is ended. Through steps shown in FIG. 10, the turn-on voltage Von is compensated with the turn-on voltage Von".

FIG. 11A shows an example in which it is determined that the compensation is successful when a current flows through all bit lines. However, according to an embodiment, it may be determined that the compensation is successful when a current flows through a bit line of which the number is less than a specific threshold value.

For example, when the drain select transistor which are turned off at the turn-on voltage Von" shown in FIG. 11A is less than a predetermined threshold value, it may be determined that the compensation is successful. The word "predetermined" as used herein with respect to a parameter, such as a predetermined threshold value or predetermined reference number etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 11B:
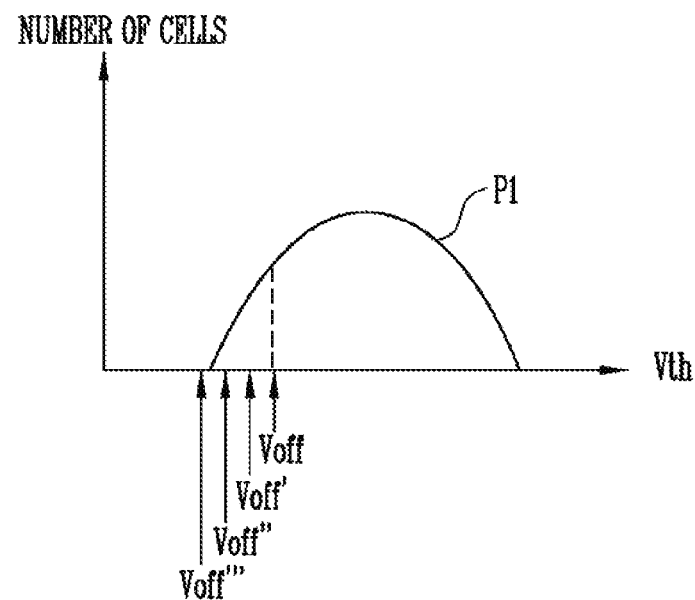
FIG. 11B is a graph for describing a method of compensating a turn-off voltage of the select transistor.

In FIGS. 10 and 11A, an embodiment in which the turn-on voltage of the drain select transistor is compensated is shown. However, according to an embodiment of the present disclosure, the turn-off voltage of the drain select transistor or the source select transistor may also be compensated. FIG. 11B is a graph for describing a method of compensating the turn-off voltage of the select transistor.

First, the turn-off voltage Voff of the select transistor is reduced to a turn-off voltage Voff'. Thereafter, the reduced turn-off voltage Voff' is applied to the drain select transistor, and the pass voltage is applied to the word lines. In addition, the turn-on voltage Von is applied to the source select transistor.

Since the pass voltage is applied to all word lines, all memory cells will be turned on. On the other hand, when it is assumed that the threshold voltage distribution of the source select transistor is not degraded, all source select transistors will also be turned on. Therefore, as a result of bit line sensing, the drain select transistors having a threshold voltage less than the reduced turn-off voltage Vff' are turned on. On the other hand, the drain select transistors having a threshold voltage greater than the reduced turn-off voltage Voff' are turned off. Since there are drain select transistors which are turned on, a current will flow through some bit lines as a result of sensing. Accordingly, it is determined that the compensation is failed and the turn-off voltage Voff' of the drain select transistor is reduced again to a turn-off voltage Voff".

There are some drain select transistors which are turned on even in a case by the reduced turn-off voltage Voff". Therefore, the turn-off voltage Voff" is reduced again to a turn-off voltage Voff'". Since there is no drain select transistor having a threshold voltage less than the reduced turn-off voltage Voff'", no current will flow through all bit lines. Thus, it is determined that the compensation is successful. In an embodiment, in determining whether or not the compensation of the turn-off voltage is successful, it may be determined that the compensation of the turn-off voltage is successful when the number of activated bit lines is less than a predetermined reference number.

FIG. 12 is a flowchart illustrating step S170 of FIG. 9. In particular, FIG. 12 illustrates, for example, step S170 when the operation performed in step S110 of FIG. 9 is the read operation.

Referring to FIG. 12, step S170 includes performing the read operation for the selected memory block based on the compensated operation voltage (S310), and determining whether or not the compensated operation voltage is greater than a predetermined threshold voltage (S330). According to an embodiment, when the compensated operation voltage is greater than the threshold voltage (S330: YES), copying data of the selected memory block to another memory block (S350), and processing the selected memory block as a bad block (S370) may further be included.

In step S310, the read operation which has failed in step S110 may be performed again based on the compensated operation voltage. The compensated operation voltage may be the turn-on voltage or the turn-off voltage of the select transistor. In addition, the select transistor to which the compensated operation voltage is applied may be the drain select transistor or the source select transistor. Although an example of the read operation is shown in FIG. 12, step S310 may also be performed on the program operation or the erase operation. That is, when the operation which has failed in step S110 is the program operation, the program operation will be performed based on the compensated operation voltage in step S310. On the other hand, when the operation which has failed in step S110 is the erase operation, the erase operation will be performed based on the compensated operation voltage in step S310.

Thereafter, in step S330, it is determined whether or not the compensated operation voltage is greater than the threshold voltage. For example, in step S330, it is determined whether or not the compensated turn-on voltage is greater than the threshold voltage. In this case, the threshold voltage may have a value significantly greater than a normal turn-on voltage. When the compensated turn-on voltage is not greater than the threshold voltage, it is determined that a corresponding memory block may be continuously used, and step S170 is ended.

When the compensated turn-on voltage is greater than the threshold voltage, since a degree of the degradation of the threshold voltage distribution of the select transistor is large, causing the memory block not to be used any more is advantageous in terms of operation stability.

Accordingly, the data of the selected memory block is copied to another memory block in step S350 (S350). Thereafter, the selected memory block is processed as the bad block so as not to use a corresponding memory block any more.

In step S330 of FIG. 12, it is determined whether or not the compensated operation voltage, that is, the turn-on voltage is greater than the threshold voltage. When the compensated operation voltage is the turn-off voltage, in step S330, it is determined whether or not the compensated operation voltage is less than the threshold voltage. In this case, the threshold voltage may have a value significantly less than a normal turn-off voltage. When the compensated turn-off voltage is not less than the threshold voltage, it is determined that the memory block may be continuously used, and the step S170 is ended.

When the compensated turn-off voltage is less than the threshold voltage, since the degree of the degradation of the threshold voltage distribution of the select transistor is large, causing the memory block not to be used any more is advantageous in terms of operation stability. Therefore, in this case, steps S350 and S370 are performed.

In FIG. 12, an example of the read operation is shown, and thus copying the data stored in the memory block to another memory block (S350) is shown. Steps S330, S350, and S370 may also be performed on the program operation. That is, the program operation is performed based on the compensated operation voltage in step S310, and when the compensated operation voltage is greater than the threshold voltage (S330: YES), data programmed in the selected memory block may be copied to another memory block (S350), and the selected memory block may be processed as the bad block (S370).

However, when the operation performed in step S310 is the erase operation, since there is no data stored in a corresponding memory block as a result of the erase operation, step S350 may not be performed. In this case, the erase operation is performed based on the compensated operation voltage in step S310, and when the compensated operation voltage is greater than the threshold voltage (S330: YES), a corresponding memory block is processed as the bad block (S370).

According to the controller according to the embodiments of the present disclosure, when the operation of the semiconductor memory device is failed due to the threshold voltage distribution degradation of the select transistor, the semiconductor memory device is controlled to perform a corresponding operation again by compensating the operation voltage of the select transistor, that is, the turn-on voltage or the turn-off voltage (S310). In addition, when the compensated turn-on voltage has an excessively large value or the compensated turn-off voltage has an excessively small value (S330: YES), the corresponding memory block is processed as the bad block so as not to be used any more (S370). When valid data is stored in the corresponding memory block before the bad block process of the selected memory block, corresponding data is copied to another memory block (S350). Thus, the operation stability of the memory system including the semiconductor memory device and the controller is improved.

Figure 13:
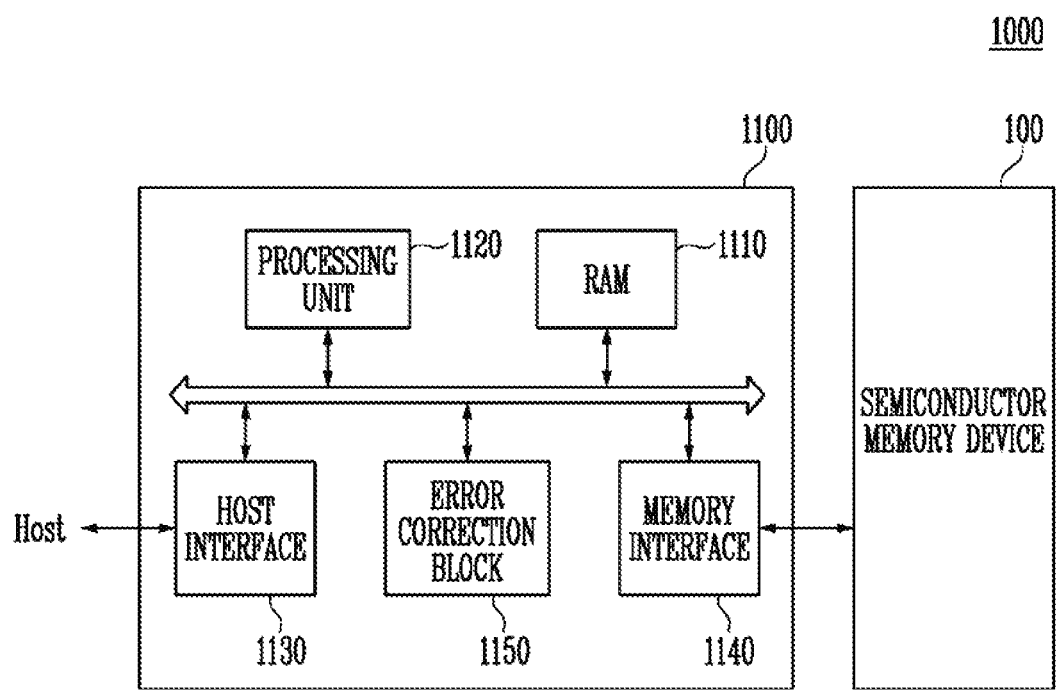
FIG. 13 is a block diagram illustrating a memory system including the semiconductor memory device of FIG. 1.

FIG. 13 is a block diagram illustrating a memory system including the semiconductor memory device of FIG. 1.

Referring to FIG. 13, the memory system 1000 includes the semiconductor memory device 100 and a controller 1100. The semiconductor memory device 100 may be the semiconductor memory device described with reference to FIG. 1. Hereinafter, a repetitive description will be omitted.

The controller 1100 is connected to a host Host and the semiconductor memory device 100. The controller 1100 is configured to access the semiconductor memory device 100 in response to a request from the host Host. For example, the controller 1100 is configured to control the read operation, the write operation, and a background operation of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls all operations of the controller 1100. In addition, the controller 1100 may temporarily store program data provided from the host Host during a write operation.

The host interface 1130 includes a protocol for performing data exchange between the host Host and the controller 1100. As an example of an embodiment, the controller 1100 is configured to communicate with the host Host through at least one of various interface protocols such as a universal serial bus (USB) protocol, a multimedia card (MMC) protocol, a peripheral component interconnection (PCI) protocol, a peripheral component interconnect-express (PCI-express) protocol, an advanced technology attachment (ATA) protocol, a serial ATA (SATA) protocol, a parallel ATA (PATA) protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error of data received from the semiconductor memory device 100 using an error correcting code (ECC). The processing unit 1120 will control the semiconductor memory device 100 to adjust a read voltage and perform the read operation again in accordance with an error detection result of the error correction block 1150. As an example of an embodiment, the error correction block 1150 may be provided as a component of the controller 1100.

The controller 1100 and the semiconductor memory device 100 may be integrated into one semiconductor device. As an example of an embodiment, the controller 1100 and the semiconductor memory device 100 may be integrated into one semiconductor device to form a memory card. For example, the controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the semiconductor memory device 100 or memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP).

Figure 14:
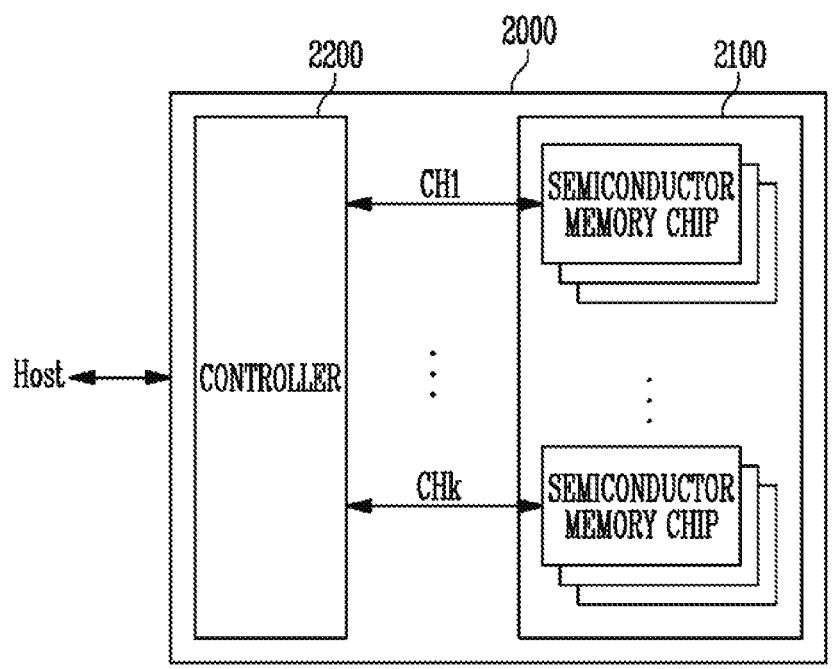
FIG. 14 is a block diagram illustrating an application example of the memory system of FIG. 13.

FIG. 14 is a block diagram illustrating an application example of the memory system of FIG. 13.

Referring to FIG. 14, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 14, the plurality of groups communicate with the controller 2200 through first to k-th channels CH1 to CHk, respectively. Each semiconductor memory chip is configured and is operated similarly to one of the semiconductor memory device 100 described with reference to FIG. 1.

Each group is configured to communicate with the controller 2200 through one common channel. The controller 2200 is configured similarly to the controller 1100 described with reference to FIG. 13 and is configured to control the plurality of memory chips of the semiconductor memory device 2100 through the plurality of channels CH1 to CHk.

Figure 15:
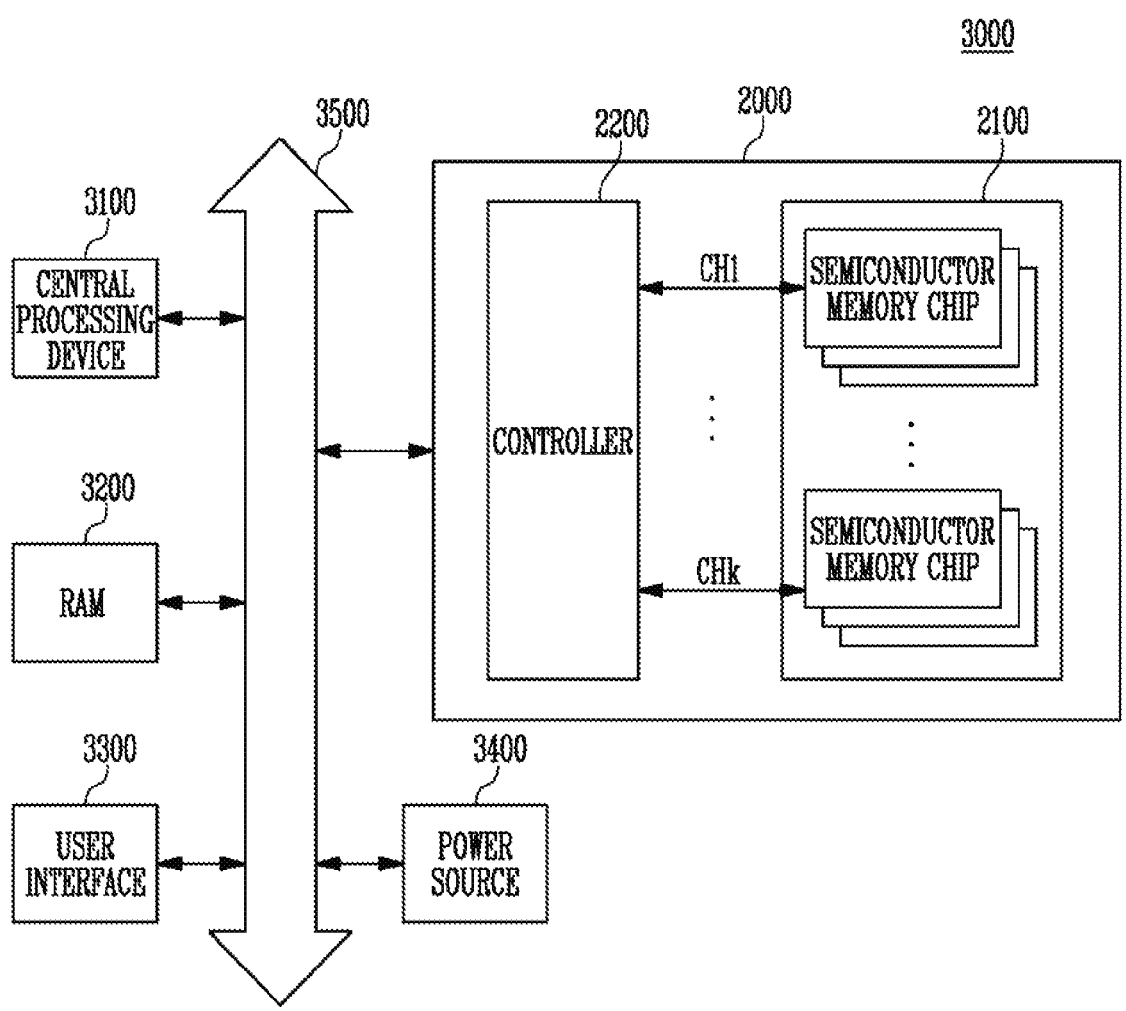
FIG. 15 is a block diagram illustrating a computing system including the memory system described with reference to FIG. 14.

FIG. 15 is a block diagram illustrating a computing system including the memory system described with reference to FIG. 14.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 15, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 15, the memory system 2000 described with reference to FIG. 14 is provided. However, the memory system 2000 may be replaced with the memory system 1000 described with reference to FIG. 13. As an example of an embodiment, the computing system 3000 may be configured to include both of the memory systems 1000 and 2000 described with reference to FIGS. 13 and 14.

The embodiments of the present disclosure disclosed in the present specification and drawings are merely examples for describing the technical content of the present disclosure and facilitating understanding of the present disclosure and do not limit the scope of the present disclosure. It will be apparent to a person skilled in the art to which the present disclosure pertains that other modifications based on the technical spirit of the present disclosure may be carried out in addition to the embodiments disclosed herein.

What is claimed is:

1. A method of operating a controller that controls an operation of a semiconductor memory device, the method comprising:
controlling the semiconductor memory device to perform an operation for a selected memory block;
determining whether or not the operation is successful; and
compensating for a change in a threshold voltage distribution of select transistors by changing an operation voltage applied to gates of the select transistors included in the selected memory block, based on whether or not the operation is successful.

2. The method according to claim 1, wherein the operation voltage is a turn-on voltage applied to the gates of the select transistors, and
the compensating for the change in the threshold voltage distribution of the select transistors by changing the operation voltage applied to the gates of the select transistors included in the selected memory block based on whether or not the operation is successful comprises:
controlling the semiconductor memory device to increase the turn-on voltage when the operation has failed;
controlling the semiconductor memory device to apply the turn-on voltage to the gates of the select transistors and to apply a pass voltage to a word line connected to the selected memory block;
controlling the semiconductor memory device to perform a current sensing operation for respective bit lines connected to the select transistors; and
determining whether or not the change in the turn-on voltage is successful in compensating for the change in the threshold voltage distribution of the select transistors based on a result of the current sensing operation.

3. The method according to claim 2, wherein the change in the turn-on voltage is successful for compensating for the change in the threshold voltage distribution of the select transistors when the number of inactivated bit lines is less than a predetermined reference number.

4. The method according to claim 3, wherein the compensating for the change in the threshold voltage distribution of the select transistors by changing the operation voltage applied to the gates of the select transistors included in the selected memory block comprises:
controlling the semiconductor memory device to increase the turn-on voltage again when the turn-on voltage has failed to compensate for the change in the threshold voltage distribution of the select transistors.

5. The method according to claim 1, wherein the operation voltage is a turn-off voltage applied to the gates of the select transistors, and
the compensating for the change in the threshold voltage distribution of the select transistors by changing the operation voltage applied to the gates of the select transistors included in the selected memory block based on whether or not the operation is successful comprises:
controlling the semiconductor memory device to reduce the turn-off voltage when the operation has failed;
controlling the semiconductor memory device to apply the turn-off voltage to the gates of the select transistors and to apply a pass voltage to a word line connected to the selected memory block;
controlling the semiconductor memory device to perform a current sensing operation for respective bit lines connected to the select transistors; and
determining whether or not the change in the turn-off voltage is successful in compensating for the change in the threshold voltage distribution of the select transistors based on a result of the current sensing operation.

6. The method according to claim 5, wherein the change in the turn-off voltage is successful for compensating for the change in the threshold voltage distribution of the select transistors when the number of activated bit lines is less than a predetermined reference number.

7. The method according to claim 6, wherein the compensating for the change in the threshold voltage distribution of the select transistors by changing the operation voltage applied to the gates of the select transistors included in the selected memory block comprises:
controlling the semiconductor memory device to reduce the turn-off voltage again when the turn-off voltage has failed to compensate for the change in the threshold voltage distribution of the select transistors.

8. The method according to claim 1, further comprising:
performing the operation based on the changed operation voltage applied to the gates of the select transistors.

9. The method according to claim 8, wherein the operation is a read operation or a program operation, the operation voltage is a turn-on voltage applied to the gates of the select transistors, and
the performing the operation based on the changed operation voltage comprises:
controlling the semiconductor memory device to perform a read operation or a program operation for the selected memory block, based on the compensated turn-on voltage;
determining whether or not the compensated turn-on voltage is greater than a predetermined threshold voltage;
copying data of the selected memory block to another memory block when the compensated turn-on voltage is greater than the threshold voltage; and
processing the selected memory block as a bad memory block.

10. The method according to claim 8, wherein the operation is an erase operation, the operation voltage is a turn-on voltage applied to the gates of the select transistors, and
the performing the operation based on the changed operation voltage comprises:
controlling the semiconductor memory device to perform an erase operation for the selected memory block, based on the compensated turn-on voltage;
determining whether or not the compensated turn-on voltage is greater than a predetermined threshold voltage; and
processing the selected memory block as a bad memory block when the compensated turn-on voltage is greater than the threshold voltage.

11. The method according to claim 8, wherein the operation is a read operation or a program operation, the operation voltage is a turn-off voltage applied to the gates of the select transistors, and
the performing the operation based on the changed operation voltage comprises:
controlling the semiconductor memory device to perform a read operation or a program operation for the selected memory block, based on the compensated turn-off voltage;
determining whether or not the compensated turn-off voltage is less than a predetermined threshold voltage;
copying data of the selected memory block to another memory block when the compensated turn-off voltage is less than the threshold voltage; and
processing the selected memory block as a bad memory block.

12. The method according to claim 8, wherein the operation is an erase operation, the operation voltage is a turn-off voltage applied to the gates of the select transistors, and
the performing the operation based on the changed operation voltage comprises:
controlling the semiconductor memory device to perform an erase operation for the selected memory block, based on the compensated turn-off voltage;
determining whether or not the compensated turn-off voltage is less than a predetermined threshold voltage; and
processing the selected memory block as a bad memory block when the compensated turn-off voltage is less than the threshold voltage.

13. A memory system comprising:
a semiconductor memory device including a plurality of memory blocks; and
a controller configured to control an operation of the semiconductor memory device,
wherein the plurality of memory blocks includes a plurality of memory cells connected to a plurality of word lines and a plurality of select transistors connected to a select line, respectively, and
the controller controls the semiconductor memory device to perform an operation for a selected memory block among the plurality of memory blocks, and controls the semiconductor memory device to compensate for a change in a threshold voltage distribution of the select transistors by changing an operation voltage applied to gates of the select transistors included in the selected memory block when the operation has failed.

14. The memory system according to claim 13, wherein the operation voltage is a turn-on voltage applied to the gates of the select transistors,
the controller controls the semiconductor memory device to increase the turn-on voltage when the operation has failed, and
the semiconductor memory device applies the increased turn-on voltage to the gates of the select, applies a pass voltage to a word line connected to the selected memory block, and performs a current sensing operation for respective bit lines connected to the select transistors to transfer a result of the current sensing operation to the controller.

15. The memory system according to claim 14, wherein the controller determines whether or not the increase in the turn-on voltage is successful in compensating for the change in the threshold voltage distribution of the select transistors based on the received result of the current sensing operation, and controls the semiconductor memory device to increase the turn-on voltage again when the compensation for the change in the threshold voltage distribution of the select transistors by increasing the turn-on voltage has failed.

16. The memory system according to claim 13, wherein the operation voltage is a turn-off voltage applied to the gates of the select transistors,
the controller controls the semiconductor memory device to reduce the turn-off voltage when the operation has failed, and
the semiconductor memory device applies the reduced turn-off voltage to the gates of the select transistors applies a pass voltage to a word line connected to the selected memory block, and performs a current sensing operation for respective bit lines connected to the select transistors to transfer a result of the current sensing operation to the controller.

17. The memory system according to claim 16, wherein the controller determines whether or not the reduction in the turn-off voltage is successful in compensating for the change in the threshold voltage distribution of the select transistors based on the received result of the current sensing operation, and controls the semiconductor memory device to reduce the turn-off voltage again when the compensation for the change in the threshold voltage distribution of the select transistors by reducing the turn-off voltage has failed.

18. The memory system according to claim 14, wherein the controller determines whether or not the increase in the turn-on voltage is successful in compensating for the change in the threshold voltage distribution of the select transistors based on the received result of the current sensing operation, and determines whether or not the turn-on voltage is greater than a predetermined threshold voltage when the compensation for the change in the threshold voltage distribution of the select transistors by increasing the turn-on voltage is successful.

19. The memory system according to claim 18, wherein the controller processes the selected memory block as a bad memory block when the turn-on voltage is greater than the threshold voltage.

20. The memory system according to claim 16, wherein the controller determines whether or not the reduction in the turn-off voltage is successful in compensating for the change in the threshold voltage distribution of the select transistors based on the received result of the current sensing operation, and determines whether or not the turn-off voltage is less than a predetermined threshold voltage when the compensation for the change in the threshold voltage distribution of the select transistors by reducing the turn-off voltage is successful.

* * * * *